US010831242B1

(12) United States Patent
He et al.

(10) Patent No.: US 10,831,242 B1
(45) Date of Patent: Nov. 10, 2020

(54) FOLDING DEVICE, DISPLAY SCREEN COMPONENT AND MOBILE TERMINAL

(71) Applicant: BEIJING XIAOMI MOBILE SOFTWARE CO., LTD., Beijing (CN)

(72) Inventors: Jingsong He, Beijing (CN); Bin Lin, Beijing (CN); Song Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/699,551

(22) Filed: Nov. 29, 2019

(30) Foreign Application Priority Data

Jun. 14, 2019 (CN) .......................... 2019 1 0516738

(51) Int. Cl.
*G06F 1/16* (2006.01)
*H05K 5/00* (2006.01)
*H04M 1/02* (2006.01)
*H05K 5/02* (2006.01)

(52) U.S. Cl.
CPC .......... *G06F 1/1652* (2013.01); *G06F 1/1656* (2013.01); *H04M 1/0268* (2013.01); *H05K 5/0017* (2013.01); *H05K 5/0226* (2013.01); *G06F 1/1626* (2013.01)

(58) Field of Classification Search
CPC combination set(s) only.
See application file for complete search history.

(56) References Cited

U.S. PATENT DOCUMENTS

| 6,324,787 | B1 | 12/2001 | Burr | |
|---|---|---|---|---|
| 2008/0308755 | A1* | 12/2008 | Hashizume | ......... H04M 1/0216 250/553 |
| 2009/0151487 | A1 | 6/2009 | Kim | |
| 2009/0237872 | A1* | 9/2009 | Bennelnnans | ........ G06F 1/1615 361/679.01 |
| 2017/0208157 | A1 | 7/2017 | Kim et al. | |
| 2020/0081486 | A1* | 3/2020 | Lin | ........................ G06F 1/1616 |
| 2020/0081487 | A1* | 3/2020 | Lin | ........................ H04M 1/02 |

(Continued)

FOREIGN PATENT DOCUMENTS

| CN | 208112673 U | 11/2018 |
|---|---|---|
| CN | 109298844 A | 2/2019 |

(Continued)

OTHER PUBLICATIONS

European Search Report in the European application No. 19214667.8, dated Jun. 19, 2020.

(Continued)

*Primary Examiner* — Lisa Lea-Edmonds
(74) *Attorney, Agent, or Firm* — Syncoda LLC; Feng Ma

(57) ABSTRACT

A folding device includes a power assembly, at least one movement assembly coupled with the power assembly, and at least one group of connecting rod assembly movably coupled with the movement assembly. The connecting rod assembly is configured to movably couple with a flexible panel, and the power assembly is arranged to be fixed relative to the flexible panel. The movement assembly is configured to be moved by the power assembly, the connecting rod assembly is configured to move along with the movement assembly and rotate relative to the movement assembly, and at least a part of the flexible panel is driven by the connecting rod assembly to move and be in a folded state or an unfolded state.

20 Claims, 8 Drawing Sheets

(56) References Cited

U.S. PATENT DOCUMENTS

| | | | | |
|---|---|---|---|---|
| 2020/0081494 A1* | 3/2020 | Lin | ........................ | H04M 1/022 |
| 2020/0081495 A1* | 3/2020 | Lin | ........................ | G06F 1/1681 |
| 2020/0081502 A1* | 3/2020 | Lin | ...................... | H04M 1/0214 |
| 2020/0084305 A1* | 3/2020 | Lin | ...................... | H04M 1/0216 |

FOREIGN PATENT DOCUMENTS

| | | | |
|---|---|---|---|
| CN | 208673636 U | 3/2019 | |
| CN | 109844683 A | 6/2019 | |
| JP | 2006243621 A | 9/2006 | |
| RU | 2596469 C2 | 9/2016 | |
| RU | 2683290 C2 | 3/2019 | |
| WO | 2016203321 A2 | 12/2016 | |
| WO | 2018166399 A1 | 9/2018 | |

OTHER PUBLICATIONS

International Search Report in the international application No. PCT/CN2019/111199, dated Mar. 12, 2020.
First Office Action of the Russian application No. 2019141424, dated Jul. 23, 2020.
First Office Action of the Korean application No. 10-2019-7033899, dated Jul. 17, 2020.

\* cited by examiner

US 10,831,242 B1

FOLDING DEVICE, DISPLAY SCREEN COMPONENT AND MOBILE TERMINAL

CROSS-REFERENCE TO RELATED APPLICATION

This application claims priority to Chinese patent application No. 201910516738.6 filed on Jun. 14, 2019, the disclosure of which is hereby incorporated by reference in its entirety.

BACKGROUND

A mobile terminal is provided with a display screen component as an output device of the mobile terminal. The display screen can convert information into image information recognizable for a user to look at. Along with development of display screen technologies, structural performance of display screens has also increasingly progressed. A screen area of a display screen component is enlarged, and an overall dimension of a mobile terminal is reduced.

SUMMARY

The present disclosure relates generally to the technical field of electronic devices. Various embodiments of the present disclosure provide to a folding device, a display screen component, and a mobile terminal.

According to a first aspect of embodiments of the present disclosure, a folding device is provided, which may include a power assembly, at least one movement assembly connected with the power assembly and at least one group of connecting rod assembly movably connected to the movement assembly. The connecting rod assembly may be configured to movably connect to a flexible panel, and the power assembly may be arranged to be fixed relative to the flexible panel. The movement assembly may be moved by the power assembly. The connecting rod assembly may move along with the movement of the movement assembly and rotate relative to the movement assembly. At least a part of the flexible panel may be driven by the connecting rod assembly to move and be in a folded state or an unfolded state.

According to a second aspect of the embodiments of the present disclosure, a display screen component is provided, which may include a flexible panel and at least one abovementioned folding device, and the flexible panel may be a flexible display screen.

According to a third aspect of the embodiments of the present disclosure, a mobile terminal is provided, which may include: a processor and a memory configured to store processor executable instructions. The mobile terminal may further include the abovementioned display screen component.

It is to be understood that the above general descriptions and detailed descriptions below are only exemplary and explanatory and not intended to limit the present disclosure.

BRIEF DESCRIPTION OF THE DRAWINGS

The accompanying drawings referred to in the specification are a part of this disclosure, and provide illustrative embodiments consistent with the disclosure and, together with the detailed description, serve to illustrate some embodiments of the disclosure.

Figure 1:
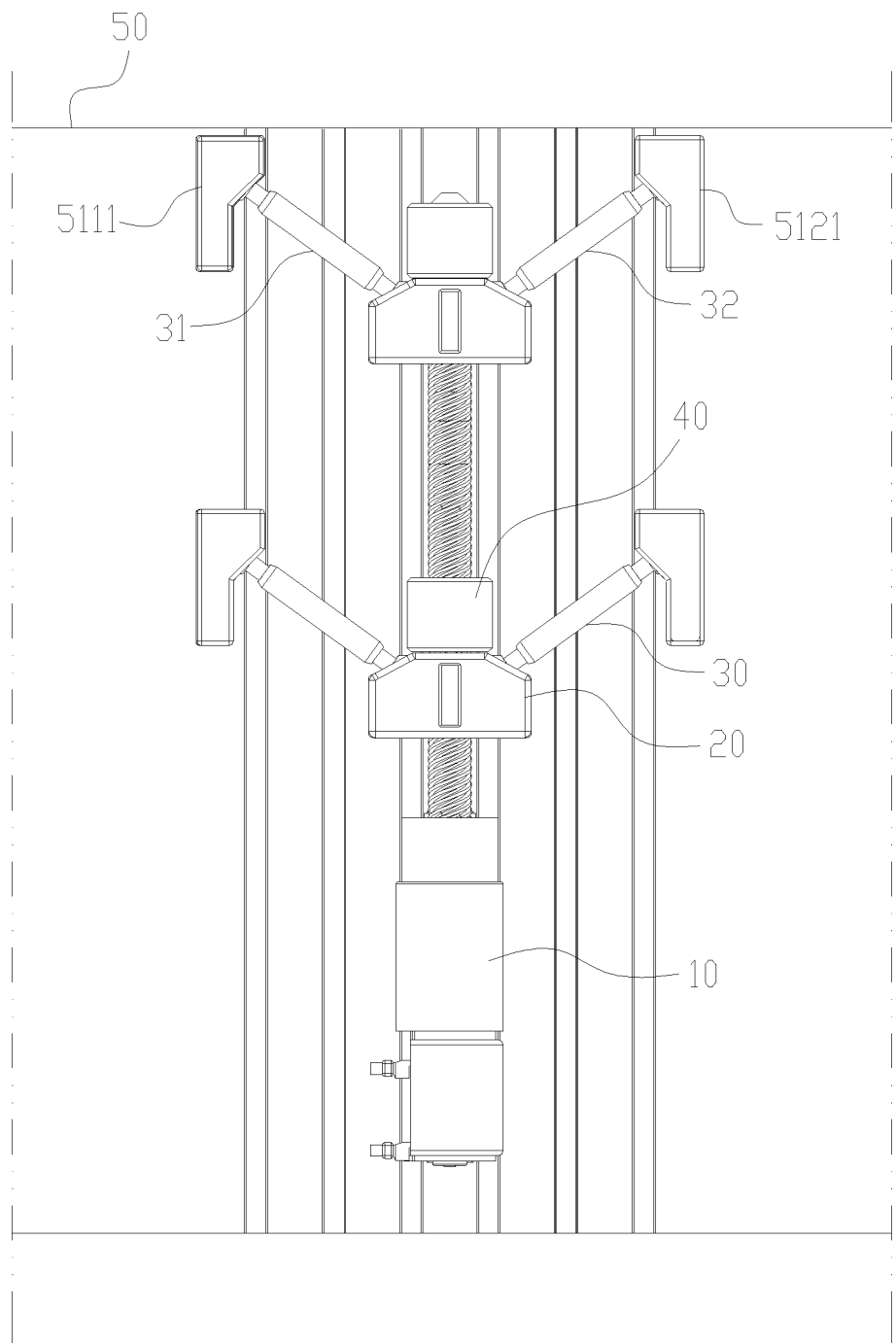
FIG. 1 is structure diagram of connection of a folding device and a flexible panel, according to some embodiments of the present disclosure.

List of reference symbols: power assembly 10; power element 11; transmission part 12; speed regulator 13; movement assembly 20; movement body 21; rotating portion 22; connecting protrusion 23; spherical groove 231; connecting rod assembly 30; left support rod 31; support rod portion 311; first connecting end 312; second connecting end 313; right support rod 32; support member 40; flexible panel 50; bracket body 51; first flat plate portion 511; first connecting portion 5111; first spherical connecting trough 5112; second flat plate portion 512; second connecting portion 5121; second spherical connecting trough 5122; hinge portion 513; first side connecting rod 5131; second side connecting rod 5132; middle connecting rod 5133; panel body 52; hinging assembly 53; hinge protrusion 531; elastic protrusion 532; elastic element 533; limiting assembly 54; mounting block 541; limiting pin shaft 542; movable block 543; sliding hole 5431; mobile terminal 60; processing assembly 61; memory 62; power supply assembly 63; a multimedia assembly 64; audio assembly 65; Input/Output (I/O) interface 66; sensor assembly 67; communication assembly 68; and processor 69.

DETAILED DESCRIPTION

Exemplary embodiments (examples of which are illustrated in the accompanying drawings) are elaborated below. The following description refers to the accompanying drawings, in which identical or similar elements in two drawings are denoted by identical reference numerals unless indicated otherwise. The exemplary implementation modes may take on multiple forms, and should not be taken as being limited to examples illustrated herein. Instead, by providing such implementation modes, embodiments herein may become more comprehensive and complete, and comprehensive concept of the exemplary implementation modes may be delivered to those skilled in the art. Implementations set forth in the following exemplary embodiments do not represent all implementations in accordance with the subject disclosure. Rather, they are merely examples of the apparatus and method in accordance with certain aspects herein as recited in the accompanying claims.

Terms used in the present disclosure are only adopted for the purpose of describing specific examples and not intended to limit the present disclosure. "A/an," "said" and "the" in a singular form in the present disclosure and the appended claims are also intended to include a plural form, unless other meanings are clearly denoted throughout the present disclosure. It is also to be understood that term "and/or" used in the present disclosure refers to and includes one or any or all possible combinations of multiple associated items that are listed.

It is to be understood that, although terms first, second, third and the like may be adopted to describe various information in the present disclosure, the information should not be limited to these terms. These terms are only used to distinguish the information of the same type. For example, without departing from the scope of the present disclosure, first information may also be called second information and, similarly, second information may also be called first information. For example, term "if" used here may be explained as "while" or "when" or "responsive to", which depends on the context.

A display screen component can comprise a flexible display screen that is deformable and bendable. For example, a flexible display screen is applied in a mobile terminal such as a mobile phone. However, in the case that a flexible display screen is applied in a mobile terminal, the folding is usually done manually.

A flexible display is a deformable and bendable display device made from a flexible material. It may be applied to a mobile phone, a tablet computer, a game device and another mobile terminal to ensure a large range of a display region of the mobile terminal, and to occupy a relatively small storage space in a folding manner (or other manner) to be convenient to carry.

Figure 2:
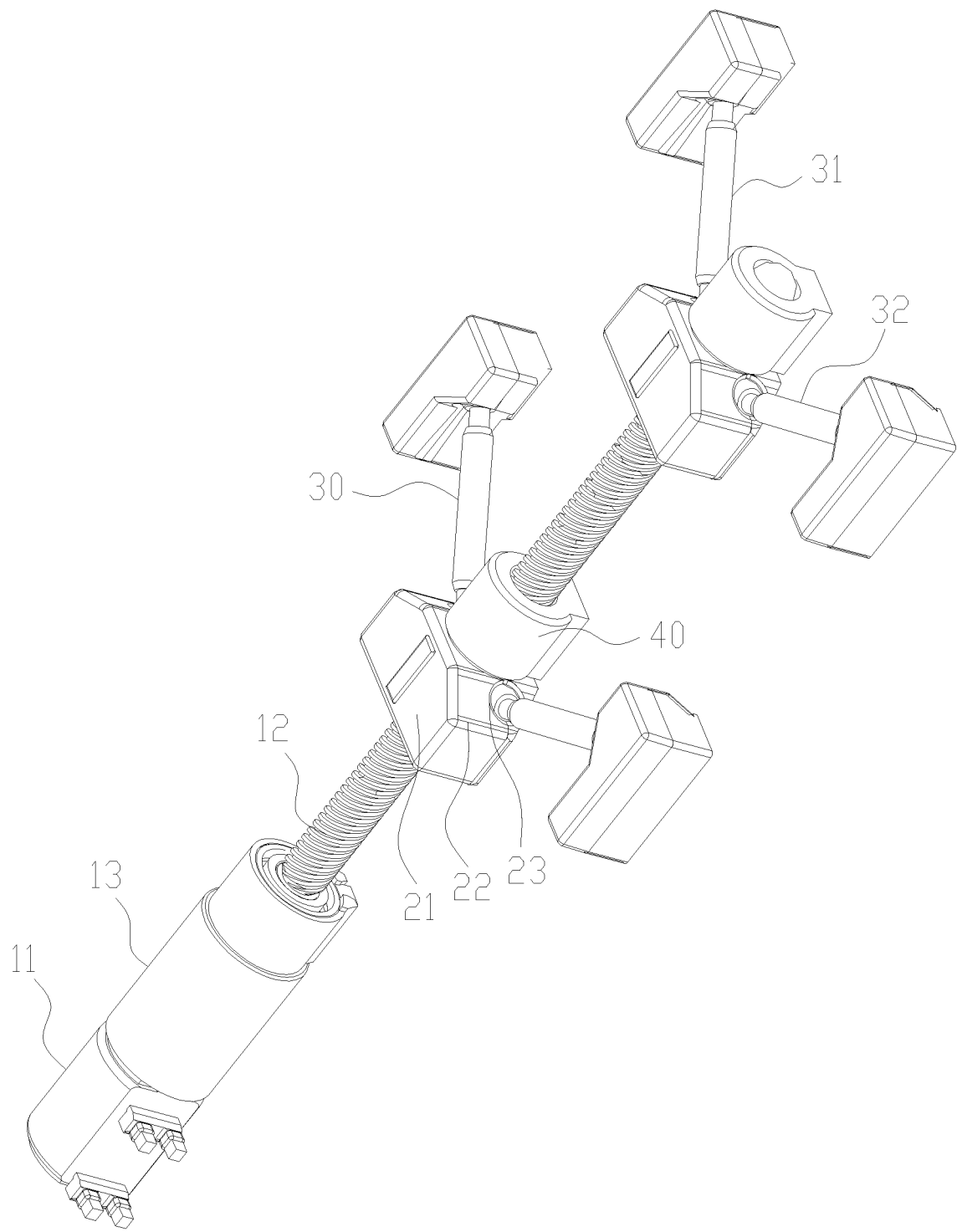
FIG. 2 is a three-dimensional structure diagram of folding device, according to some embodiments of the present disclosure.

As shown in FIG. 1 and FIG. 2, a folding device includes a power assembly 10, at least one movement assembly 20 connected to the power assembly 10 and at least one group of connecting rod assembly 30 movably connected to the movement assembly 20. The connecting rod assembly 30 is configured to movably connect to a flexible panel 50, and the power assembly 10 is arranged to be fixed relative to the flexible panel 50. The movement assembly 20 is moved by the power assembly 10. The connecting rod assembly 30 moves along with the movement of the movement assembly 20 and rotates relative to the movement assembly 20. At least a part of the flexible panel 50 is urged by the connecting rod assembly 30 to move and be in a folded state or an unfolded state.

At least a part of the flexible panel 50 may move under an action of an external force to render the flexible panel 60 in the unfolded state or the folded state. The folding device is arranged in a middle region of the flexible panel 50, and a position of the power assembly 10 is fixed relative to the flexible panel 50. In some embodiments of the present disclosure, the power assembly 10 is fixed to the flexible panel 50 to keep relative positions of the power assembly and the flexible panel unchanged. In some embodiments of the present disclosure, both the power assembly 10 and the flexible panel 50 are assembled on a mobile terminal, the power assembly 10 is fixed on a fixed seat of the mobile terminal to ensure that the relative position between the power assembly 10 and the flexible panel 50 is fixed.

A first end of the connecting rod assembly 30 is movably connected to the movement assembly 20, and a second end of the connecting rod assembly 30 is rotatably connected to the flexible panel 50. In some embodiments of the present disclosure, the connecting rod assembly 30 is in movable spherical connection with the movement assembly 20 such that the connecting rod assembly 30 may rotate relative to the movement assembly in any direction, and a rotating angle range is wide. The movable spherical connection may further limit a movement range of the connecting rod assembly 30 and transmit a thrust/tensile force transmitted by the movement assembly 20 to the flexible panel 50 to achieve a good force transmission effect.

When the movement assembly 20 is moved by the power assembly 10, a position of the movement assembly 20 gradually changes, then the first end of the connecting rod assembly 30 moves synchronously with the movement assembly 20 and rotates relative to the movement assembly 20, and correspondingly, an angle of the connecting rod assembly 30 relative to the movement assembly 20 changes. Correspondingly, the second end rotates relative to the flexible panel 50 to follow the angle change of the connecting rod assembly 30, and moreover, the flexible panel 50 is driven by the connecting rod assembly 30 to move and thus the state of the flexible panel is changed. One end of the connecting rod assembly 30 is movably connected to the movement assembly 20 and rotates along with movement of the movement assembly 20, the other end of the connecting rod assembly 30 is connected to the flexible panel 50. The connecting rod assembly 30 drives at least a part of the flexible panel 50 to be unfolded or folded during the movement of the connecting rod assembly, so that running stability can be achieved.

Movement of the flexible panel 50 includes single-side movement or double-side movement. That is, the connecting rod assembly 30 is connected to one side of the flexible panel 50, and the flexible panel 50 may be driven by the connecting rod assembly 30 to keep one side moving but the other side fixed. Or, the connecting rod assembly 30 is connected to both sides of the flexible panel 50, and the flexible panel 50 may be driven by the connecting rod assembly 30 to keep both sides moving. The movement assembly 20 is driven by the power assembly 10 to move, and correspondingly, the flexible panel 50 is gradually folded or unfolded by a corresponding angle along with movement of the movement assembly 20, so that a good angle control effect is achieved. The power assembly 10 drives the movement assembly 20 to move, to control the flexible panel 50 to move and be in the folded state or the unfolded state correspondingly, so that convenience for control is ensured. In some embodiments of the present disclosure, the movement assembly 20 is provided with at least one group of connecting rod assembly 30, and the connecting rod assembly 30 may drive the flexible panel 50 to move. It is to be noted that the movement assembly 20 is provided with two or more groups of connecting rod assemblies 30 to ensure that the movement assembly 20 may drive, through multiple groups of connecting rod assemblies 30, the flexible panel 50 to move in a movement process, so that a connection range is wide and running efficiency is high.

The power assembly 10 drives the movement assembly 20 to move to ensure that the connecting rod assembly 30 may move relative to the movement assembly 20. In some embodiments of the present disclosure, the power assembly 10 drives the movement assembly 20 to rotate or twist such that the flexible panel 50 is driven by the connecting rod assembly 30 to be unfolded or folded. The connecting rod assembly 30 is rotatably connected to the movement assembly 20 and rotates under an action of a twisting force or tangential force of the movement assembly 20 to drive the flexible panel 50 to be folded or unfolded. In some embodiments of the present disclosure, the power assembly 10 drives the movement assembly 20 to move linearly to drive the movement assembly 20 to move under an action of a thrust or tensile force of the movement assembly 20, so that high displacement accuracy and high unfolding angle controllability of the flexible panel 50 are achieved.

The power assembly 10 drives the movement assembly 20 to move linearly to make a movement direction of the movement assembly controllable. For example, the power assembly 10 and the movement assembly 20 may be a gear-rack movement mechanism; or, the power assembly 10 and the movement assembly 20 may be a cam-connecting rod movement mechanism; or, the power assembly 10 and the movement assembly 20 may be a screw-nut mechanism. In some embodiments of the present disclosure, the power assembly 10 is in screw driving connection with the movement assembly 20 to form the screw-nut mechanism. The power assembly 10 drives the movement assembly 20 to accurately move along a linear direction to control position accuracy of the movement assembly 20. The power assembly 10 is in screw driving connection with the movement assembly 20, so that a driving force is strong, and transmission stability and high structural stability are achieved.

The power assembly 10 is in screw driving connection with the movement assembly 20 to form a screw-nut structure. In some embodiments of the present disclosure, the power assembly 10 includes a power element 11 and a transmission part 12 connected to the power element 11, the at least one movement assembly 20 is connected to the transmission part 12, and the power element 12 drives the transmission part 12 into rotation, to drive the at least one movement assembly 20 to move along an axial direction of the transmission part 12.

The power element 11 is a power unit such as a micro motor, and the transmission part 12 is connected with the power element 11 to transmit a torque force. In some embodiments of the present disclosure, the power element 11 is arranged at a speed regulator 13, and the speed regulator 13 may be a structure such as a reduction gearbox and a gearbox to regulate a rotating speed of the transmission part 12. In some embodiments of the present disclosure, the transmission part 12 is fixedly connected to an output shaft of the power element 11. In an optional example, the transmission part 12 is provided with a threaded structure, one or more movement assemblies 20 are in threaded connection with the transmission part 12, and the movement assembly 20 is connected to the flexible panel 50 through the connecting rod assembly 30. When the power element 11 drives the transmission part 12 into rotation, the one or more movement assemblies 20 simultaneously move along the axial direction of the transmission part 12, and a good transmission effect is achieved.

As shown in FIG. 1 and FIG. 2, in some embodiments of the present disclosure, there are two or more movement assemblies 20 spaced from each other by a preset distance, and the power assembly 10 may drive the movement assemblies 20 to move synchronously to stress the flexible panel 50 at multiple points, so that stable and balanced movement and a good stress effect are ensured. In a specific implementation mode, two movement assemblies 20 are arranged and distributed at the transmission part 12 at a distance, a connecting rod assembly 30 is connected to each movement assembly 20, and the two groups of connecting rod assemblies 30 are connected to the flexible panel 50 respectively and spaced. When the power element 11 drives the transmission part 12 to rotate, the two movement assemblies 20 simultaneously move, and the connecting rod assemblies 30 move in a unified manner and drive the flexible panel 50 to move synchronously, so that a good linkage effect is achieved.

The transmission part 12 may be a screw structure and axially extends to guide the movement assembly 20 to move. In some embodiments of the present disclosure, the power assembly 10 further includes a support member 40 spaced from the power element 11, and the transmission part 12 is supported by the support member 40 and rotatably connected with the support member 40. The transmission part 12 is fixed to the power element 11 and supported by the support member 40, so that high rotating stability is achieved. In some embodiments of the present disclosure, the movement assembly 20 moves on the transmission part 12 between the power element 11 and the support member 40. The support member 40 is spaced from the power element 11, and the transmission part 12 is rotatably connected to the support member 40 to keep the transmission part 12 at a stable rotating position. Particularly when the transmission part 12 is relatively long, rotating stability and rotating accuracy of the transmission part 12 may be improved by the support member 40.

In some embodiments of the present disclosure, the support member 40 includes a bearing block and at least one bearing mounted to the bearing block, and an inner circle of the bearing is connected with the transmission part 12 to support the transmission part 12 for stable rotation and provide a support force. In some embodiments of the present disclosure, when two or more movement assemblies 20 connected with the transmission part 12 are provided, the support member 40 is distributed between two adjacent movement assemblies 20 and positioned outside a stroke of the movement assembly 20 to maintain dimensional stability of the transmission part 12, reduce a disturbance quantity of the transmission part 12 subjected to a reacting force of the flexible panel 50 and ensure high movement accuracy of the movement assembly 20.

Figure 3:
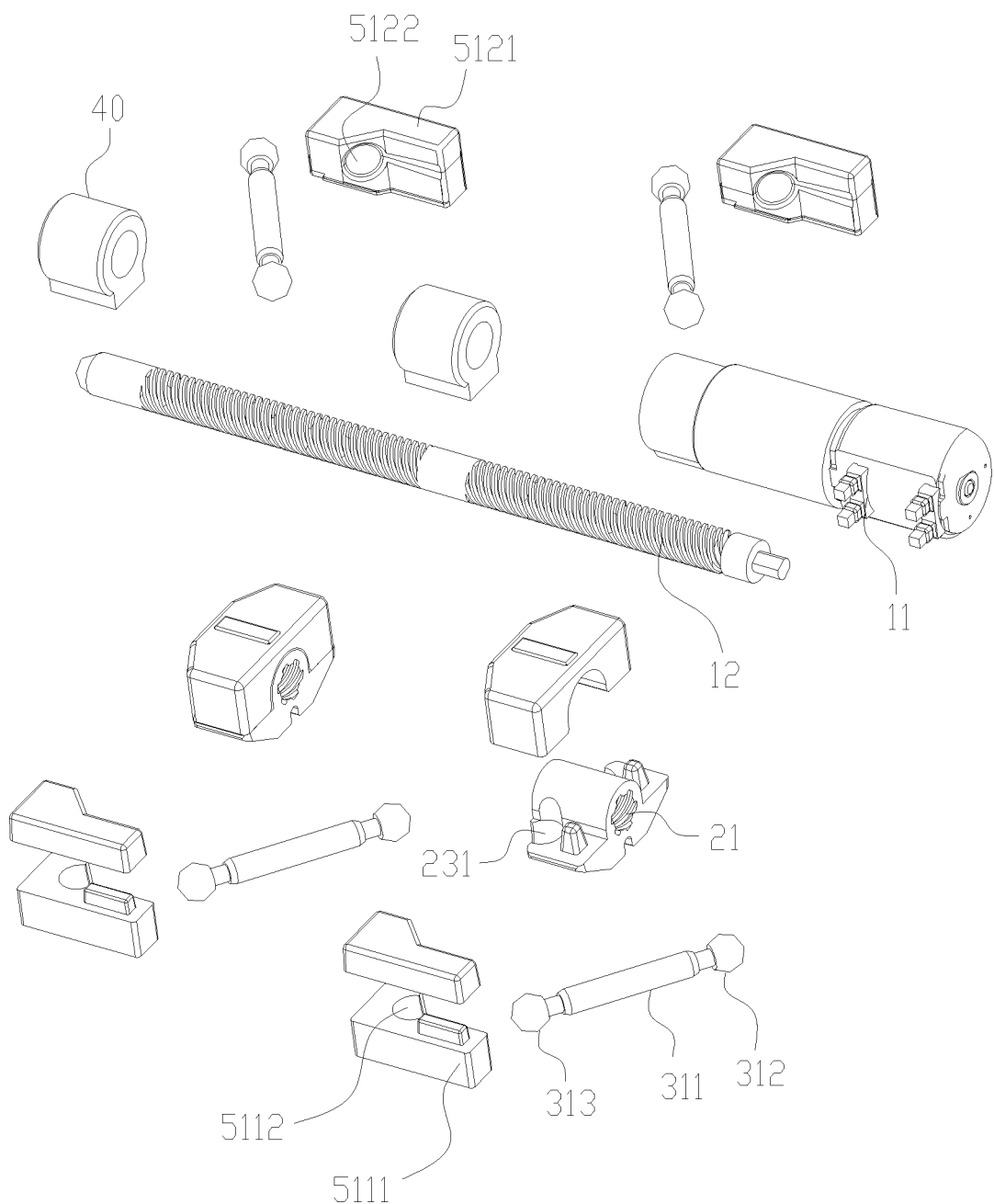
FIG. 3 is an exploded view of a folding device, according to some embodiments of the present disclosure.

As shown in FIG. 2 and FIG. 3, the connecting rod assembly 30 is configured to connect the movement assembly 20 with the flexible panel 50 to convert movement generated by the movement assembly 20 into unfolding or folding movement of the flexible panel 50. In some embodiments of the present disclosure, the connecting rod assembly 30 includes a left support rod 31 and right support rod 32 respectively connected to the movement assembly 20, the other ends of the left support rod 31 and the right support rod 32 are respectively connected to the flexible panel 50, and the left support rod 31 and the right support rod 32 may be splayed or brought together relative to each other along with movement of the movement assembly 20.

One end of each of the left support rod 31 and the right support rod 32 is movably connected to the movement assembly 20, and the other ends thereof are movably connected to the flexible panel 50 respectively. In some embodiments of the present disclosure, the left support rod 31 and the right support rod 32 are positioned on the same side of the movement assembly 20 to drive part of the flexible panel 50 to be bent and get close to the other part to form the folded state or drive part of the flexible panel 50 to be bent and get far away from the other part to form the unfolded state, so that a range of connection with the flexible panel 50 is wide, and convenience is brought to driving. In some embodiments of the present disclosure, the left support rod 31 and the right support rod 32 are positioned on the two sides of the movement assembly 20 and arranged opposite to each other to drive the flexible panel 50 on the two sides of the power assembly 10 to be synchronously bent. The two parts of the flexible panel 50 are synchronously bent and folded to form the folded state, or the two parts of the flexible panel 50 are synchronously bent to be unfolded to form the unfolded state, so that high synchronism and high bending efficiency are achieved.

In some embodiments of the present disclosure, each of the left support rod 31 and the right support rod 32 includes a support rod portion 311, as well as a first connecting end 312 and second connecting end 313 located at two ends of the support rod portion 311 respectively, the first connecting end 312 is movably connected to the movement assembly 20, and the second connecting end 313 is movably connected to the flexible panel 50.

Structures of the left support rod 31 and the right support rod 32 are substantially the same and are rod-like structures, and the first connecting end 312 and the second connecting end 313 are arranged at the two ends of the support rod portion 311. The first connecting end 312 is configured to movably connect to the movement assembly 20 such that the first connecting end 312 may rotate relative to the movement assembly 20. In some embodiments of the present disclosure, the first connecting end 312 is rotatably connected with the movement assembly 20. For example, the first connecting end 312 is hinged to the movement assembly 20. Or, the first connecting end 312 is connected with the movement assembly 20 through a universal ball structure.

In some embodiments of the present disclosure, the first connecting end 312 is provided with a spherical connecting portion, the spherical connecting portion includes a spherical protruding structure with a curved surface that is at least partially spherical such as spherical, semispherical and partially spherical surfaces, and a maximum dimension of the spherical connecting portion is larger than a sectional dimension of the support rod portion 311 to form the protruding structure. The spherical connecting portion of the first connecting end 312 is connected to the movement assembly 20, and correspondingly, the movement assembly 20 is provided with a spherical groove 231 to limit the spherical connecting portion and form the universal ball structure such that the first connecting end 312 rotates relative to the movement assembly 20.

The structure of the first connecting end 312 is the same as or similar to the structure of the second connecting end 313. For example, both the first connecting end 312 and the second connecting end 313 are provided with spherical connecting portions. The structure of the first connecting end 312 is different from the structure of the second connecting end 313. In some embodiments of the present disclosure, the second connecting end 313 is hinged to the flexible panel 50 and may rotate relative to the flexible panel 50. In some embodiments of the present disclosure, the second connecting end 313 includes a first rotating portion 22 connected to the support rod portion 311 and a second connecting portion 5121 rotatably connected to a first connecting portion 5111, and the second connecting portion 5121 is rotatably connected to the flexible panel 50 to implement universal rotation of the second connecting end 313 and achieve a good rotation effect.

The left support rod 31 and the right support rod 32 are arranged opposite to one another on the two sides of the movement assembly 20 and may simultaneously rotate relative to the movement assembly 20. In some embodiments of the present disclosure, the left support rod 31 and the right support rod 32 are distributed to be symmetric with each other, to ensure even stress and high unfolding angle consistency of the flexible panel 50.

In some embodiments of the present disclosure, the movement assembly 20 includes a movement body 21 movably connected to the power assembly 10 and a rotating portion 22 arranged at the movement body 21, and the connecting rod assembly 30 is rotatably connected to the rotating portion 22.

The movement body 21 is connected to the power assembly 10 and may be driven by the power assembly 10 to move, to drive the connecting rod assembly 30 to move, and a good transmission effect is achieved. In some embodiments of the present disclosure, the power assembly 10 is in threaded driving connection with the movement body 21 such that the movement body 21 is driven by the power assembly 10 to move linearly. The movement body 21 is provided with a threaded hole, and the power assembly 10 is provided with the transmission part 12 screwed to the threaded hole. The movement body 21 is driven by the power assembly 10 to move along the axial direction, and the connecting rod assembly 30 rotates in a movement process of the movement body 21 to drive the flexible panel 50 to be unfolded or folded. Convenience for connection is ensured, and a good linkage effect is achieved.

In some embodiments of the present disclosure, the rotating portion 22 includes at least one connecting protrusion 23 protruding from the movement body 21, and the connecting rod assembly 30 is rotatably connected with the connecting protrusion 23. The rotating portion 22 is arranged at the movement body 21 and rotatably connected with the connecting rod assembly 30, and the connecting protrusion 23 is protruded from the movement body 21 and forms a protrusion structure. The connecting rod assembly 30 is connected to the connecting protrusion 23, so that a movement range of the connecting rod assembly 30 may be extended, and assembly efficiency of the connecting rod assembly 30 may be improved. In some embodiments of the present disclosure, the connecting protrusion 23 is provided with a spherical groove 231, and the connecting rod assembly 30 is movably connected to the spherical groove 231 and may universally rotate relative to the connecting groove 231 within a wide rotation range.

In a specific implementation mode, two connecting protrusions 23 are arranged and connected with the left support rod 31 and the right support rod respectively, and the spherical connecting portions matched with the spherical grooves 231 are arranged at the first connecting ends 312 of both the left support rod 31 and the right support rod 32. A good limiting effect and high mechanical transmission performance are achieved.

Figure 4:
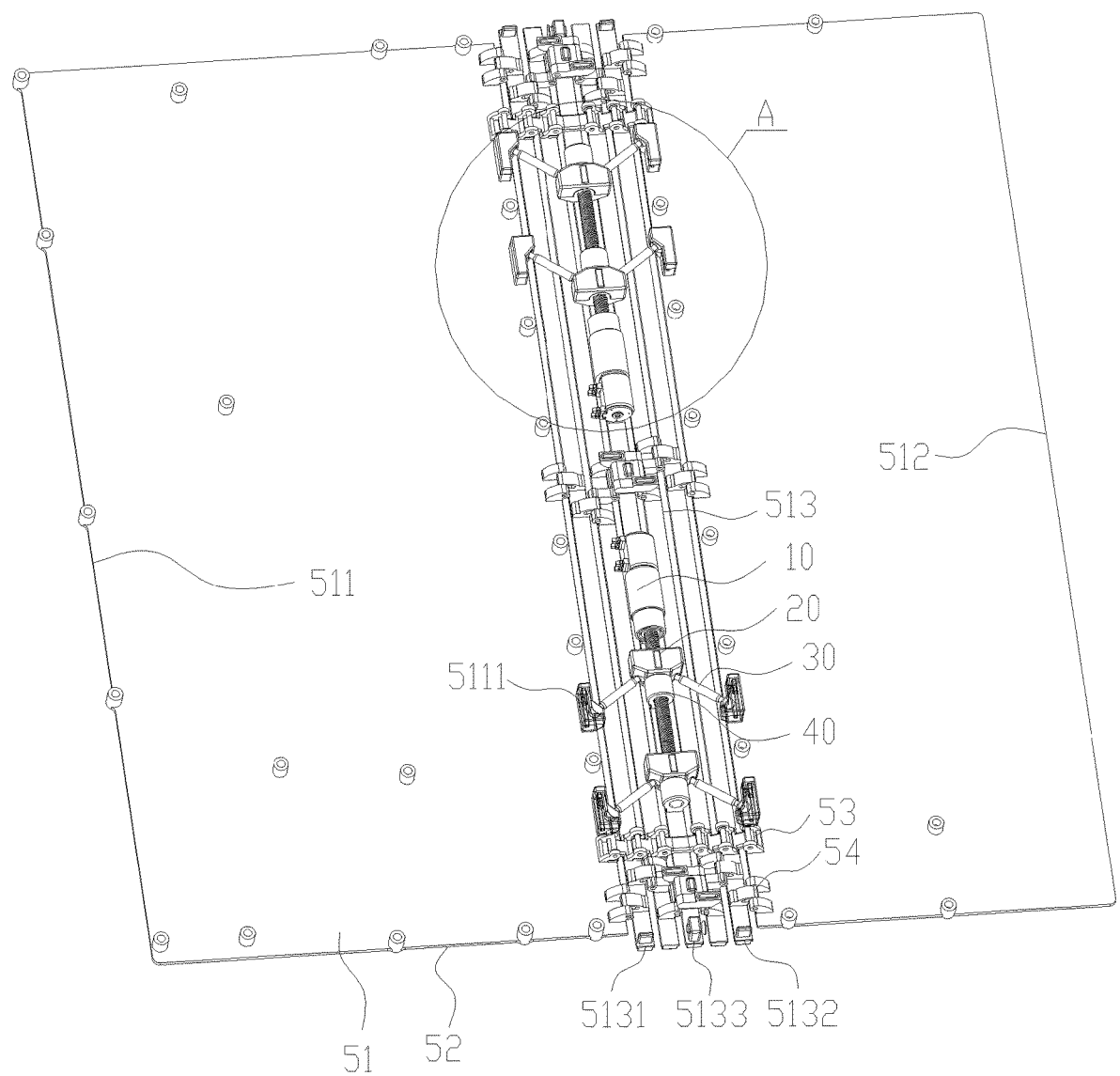
FIG. 4 is a structure diagram of a display screen component, according to some embodiments of the present disclosure.
Figure 5:
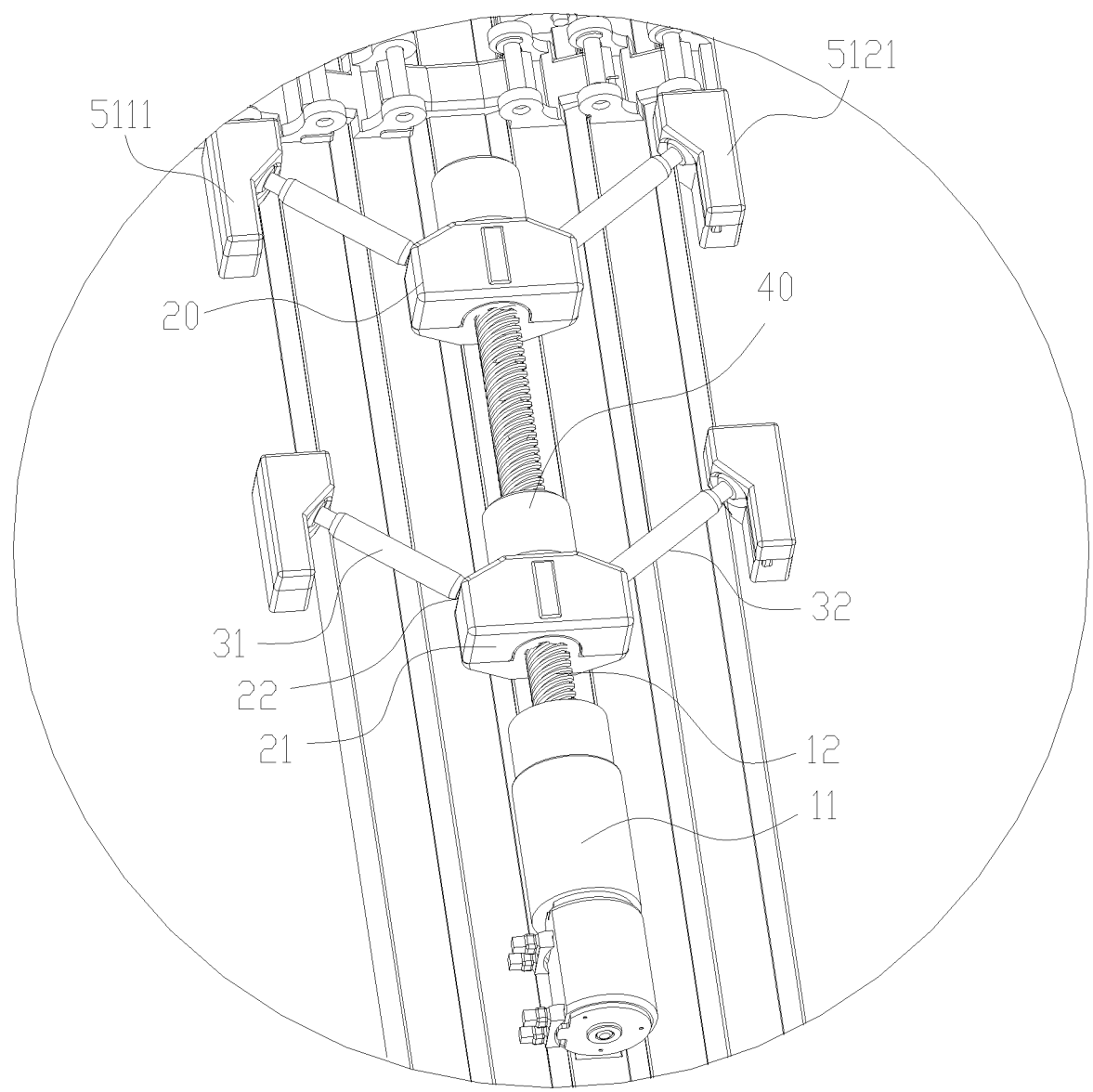
FIG. 5 is an enlarged structure diagram of part A in FIG. 4.

As shown in FIG. 4 and FIG. 5, the folding device disclosed in the abovementioned example is applied to a display screen component to implement automatic folding of the display screen component and achieve a good user experience. In some embodiments of the present disclosure, the display screen component includes a flexible panel 50 and at least one folding device disclosed in the abovementioned example, and the flexible panel 50 may be a flexible display screen.

The flexible display screen may be bent under an action of an external force to be in a folded state or a flat unfolded state. The folding device is mounted to the flexible display screen, may drive the flexible display screen to move and is convenient to operate. In addition, the folding device may also control the flexible panel 50 to be at a preset angle for a user to conveniently operate or watch and flexibly use. In some embodiments of the present disclosure, the display screen component is provided with one folding device, and the folding device is controlled by a program to drive the flexible panel 50 to move. In some embodiments of the present disclosure, the display screen component is provided with two or more folding devices, and the folding devices are distributed at the flexible panel at distances and may synchronously drive the flexible panel 50 to move, so that movement stability of the flexible panel 50 is improved, and stress uniformity of the flexible panel 50 is also improved. For example, the display screen component is provided with two folding devices, and the two folding devices get close from two ends of a bending part of the flexible panel 50 to the middle respectively, so that a contact area of the folding device and the flexible panel 50 is enlarged, and strong connecting strength and large stress surface are ensured.

In some embodiments of the present disclosure, when the two folding devices get close to each other, the two folding devices may share the same support member 40, so that the resource and space utilization rate is increased. That is, transmission parts 12 of the two folding devices are coaxially arranged and end portions of both the transmission parts 12 are rotatably connected to the same support member 40.

In some embodiments of the present disclosure, the flexible panel 50 includes a panel body 52 and a bracket body 51 mounted to the panel body 52, and the folding device is mounted to the bracket body 51 and may drive the bracket body 51 to be splayed or contracted to place the panel body 52 at a corresponding angle. The panel body 52 is configured to output image information and may be bent without influencing a display effect. The bracket body 51 is mounted to the panel body 52 to keep the panel body 52 in a corresponding shape. For example, the panel body 52 is supported by the bracket body 51 to be kept in the flat unfolded state; or, the panel body 52 is supported by the bracket body 51 to be locally bent into the folded state or unfolded by a corresponding angle.

In some embodiments of the present disclosure, the bracket body 51 is made from a rigid material, and at least part of the bracket body 51 may be bent to drive the panel body 52 to be folded. The folding device is mounted to a bending part of the bracket body 51 to drive the bracket body 51 to be bent. Convenience for driving is ensured.

In some embodiments of the present disclosure, the bracket body 51 includes a first flat plate portion 511, a second flat plate portion 512 and a hinge portion 513 connecting the first flat plate portion 511 with the second flat plate portion 512, a power assembly 10 is mounted to the hinge portion 513, and a connecting rod assembly 30 is movably connected to the first flat plate portion 511 and the second flat plate portion 512.

The panel body 52 covers one side of the bracket body 51, and the folding device is positioned on the other side of the bracket body 51 and fixed to the hinge portion 513. The power assembly 10 drives a movement assembly 20 to move such that the connecting rod assembly 30 drives the first flat plate portion 511 and the second flat plate portion 512 to be bent and further control the panel body 52 to be in the unfolded or folded state. Convenience for operation is ensured.

The hinge portion 513 is connected to the first flat plate portion 511 and the second flat plate portion 512 to limit the bending part of the bracket body 51, the bending part is controllable, and the panel body 52 is high in state controllability. In some embodiments of the present disclosure, when the folding device is arranged in a manner that the power assembly 10 may be a screw-nut structure, a rotating axis of the power assembly 10 is parallel to a bending centerline of the hinge portion 513.

Figure 6:
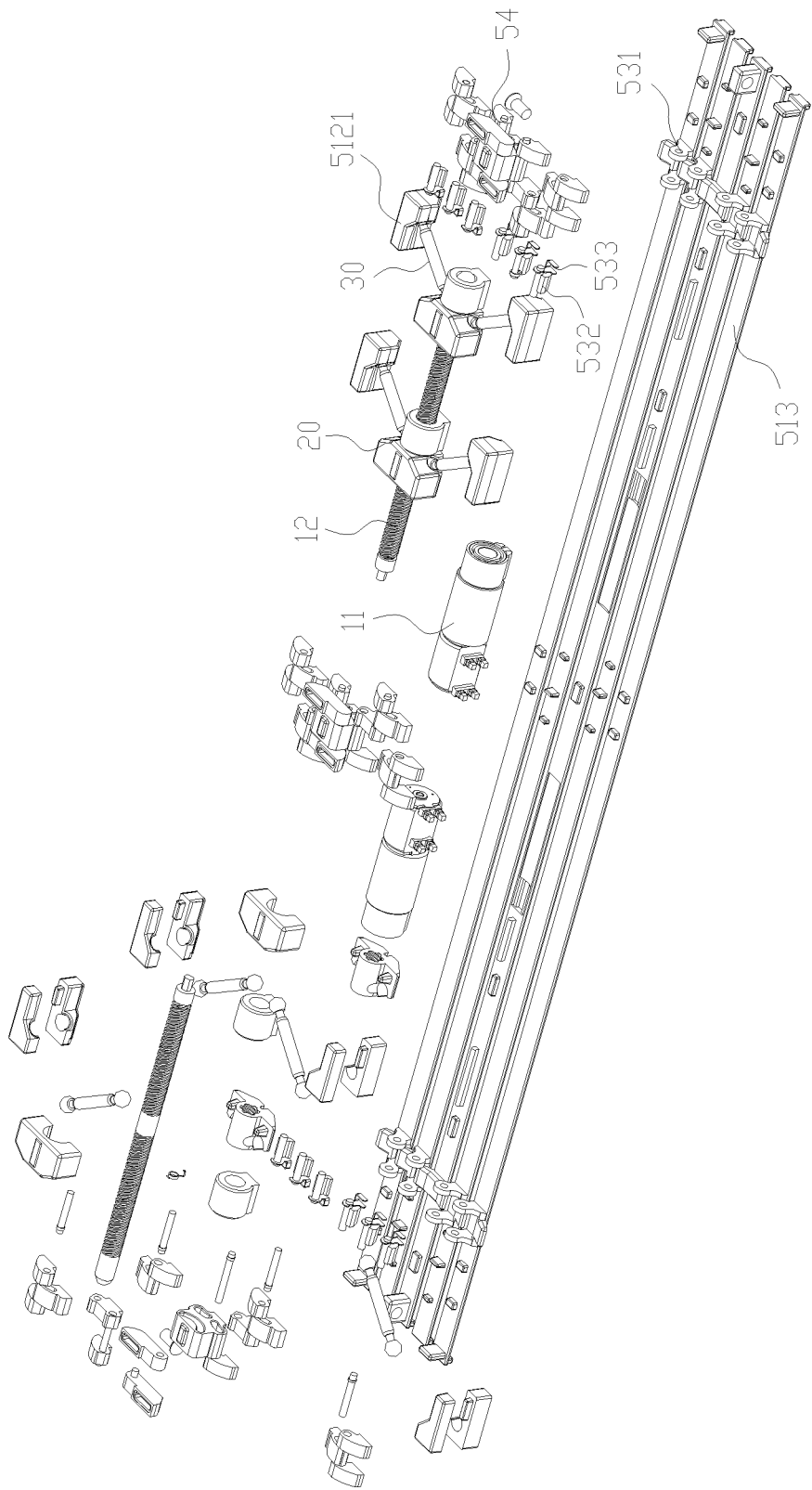
FIG. 6 is an exploded view of a display screen component, according to some embodiments of the present disclosure.

As shown in FIG. 4 and FIG. 6, the hinge portion 512, besides driving the first flat plate portion 511 and the second flat plate portion 512 to be bent, is further required to provide a rigid support for the panel body 52. In some embodiments of the present disclosure, the hinge portion 513 includes a first side connecting rod 5131, a second side connecting rod 5132 and at least one middle connecting rod 5133 which is parallel to the first side connecting rod 5131 and the second side connecting rod 5132 and is distributed between the first side connecting rod 5131 and the second side connecting rod 5132. The first side connecting rod 5131 and the second side connecting rod 5132 are hingedly connected to the middle connecting rod 5133, the first flat plate portion 511 is movably connected to the first side connecting rod 5131, and the second flat plate portion 512 is movably connected to the second side connecting rod 5132.

The first side connecting rod 5131, the second side connecting rod 5132 and the at least one middle connecting rod 5133 are parallel to one another. When the panel body 52 is in the folded state, edges of the first side connecting rod 5131, the middle connecting rod 5133 and the second side connecting rod 5132 are close or get close to form a cambered structure to keep the structure and shape of the panel body 52 stable. When the panel body 52 is in the unfolded state, the first side connecting rod 5131, the middle connecting rod 5133 and the second side connecting rod 5132 are tiled under an action of a tensile force to keep a support force on the panel body 52. Moreover, the first side connecting rod 5131, the middle connecting rod 5133 and the second side connecting rod 5132 are sequentially hinged, and the hinge portion 513 is high in structural stability.

The folding device is mounted to the hinge portion 513. In some embodiments of the present disclosure, the folding device is mounted to the middle connecting rod 5133 such that the first flat plate portion 511 and the second flat plate portion 512 control the hinge portion 513 to be bent under an action of an acting force of the connecting rod assembly 30, and a good linkage effect is achieved. In some embodiments of the present disclosure, the number of the middle connecting rod 5133 is one, the folding device is mounted to the middle connecting rod 5133 and the hinge portion 513 is arranged symmetrically with respect to the folding device, to ensure folding stability. For example, three middle connecting rods 5133 are arranged, and the folding device is fixed to the middle connecting rod 5133 at a middle position.

In some embodiments of the present disclosure, the folding device is mounted to the hinge portion 513 and connected to the first flat plate portion 511 and the second flat plate portion 512 to control the bracket body 51 to move. In some embodiments of the present disclosure, the folding device is fixed to a fixed frame, and both the first flat plate portion 511 and the second flat plate portion 512 are connected with the folding device such that the folding device may drive at least one of the first flat plate portion 511 and the second flat plate portion 512 to move to change a movement state of the display screen component. In some embodiments of the present disclosure, the first flat plate portion 511 is provided with at least one first connecting portion 5111, the second flat plate portion 512 is provided with at least one second connecting portion 5121, and the connecting rod assembly 30 is movably connected to the first connecting portion 5111 and the second connecting portion 5121 respectively. The first connecting portion 5111 and the connecting rod assembly 30 move such that the connecting rod assembly 30 is driven by the movement assembly 20 to transmit an acting force to the first connecting portion 5111. When the folding device is provided with two or more groups of connecting rod assemblies 30, the first flat plate portion 511 is provided with first connecting portions 5111 corresponding to the connecting rod assemblies 30, and the second flat plate portion 512 is provided with second connecting portions 5121 corresponding to the connecting rod assemblies 30. A good connection effect is achieved.

As shown in FIG. 3 and FIG. 4, the connecting rod assembly 30 is connected to the first flat plate portion 511 and the second flat plate portion 512 and may rotate relative to the first flat plate portion 511 and the second flat plate portion 512 to avoid interference. In some embodiments of the present disclosure, the first connecting portion 5111 is provided with a first spherical connecting trough 5112, and the connecting rod assembly 30 is rotatably connected with the first spherical connecting trough 5112; and/or, the second connecting portion 5121 is provided with a second spherical connecting trough 5122, and the connecting rod assembly 30 is rotatably connected with the second spherical connecting trough 5122.

A second connecting end 313 of a left support rod 31 is connected with the first spherical connecting trough 5112 and a second connecting end 313 of a right support rod 32 is connected with the second spherical connecting trough 5122, so that the connecting rod assembly 30 may rotate relative to the first connecting portion 5111 and the second connecting portion 5121, a rotation range is wide, and a connection effect is good. The first spherical connecting trough 5112 and the second spherical connecting trough 5122 may bear the tensile force and thrust of the connecting rod assembly 30 and are high in stress performance.

In some embodiments of the present disclosure, the flexible panel 50 further includes at least one hinging assembly 53, and the hinging assembly 53 is configured to connect the first flat plate portion 511, the second flat plate portion 512 and the hinge portion 513 to connect the first flat plate portion 511, the second flat plate portion 512 and the hinge portion 513 into a whole and allow a relative rotation between the first flat plate portion, the second flat plate portion and the hinge portion. In some embodiments of the present disclosure, the hinging assembly 53 includes hinge protrusions 531, elastic bumps 532 movably connected to each hinge protrusion 531 and elastic elements 533 mounted correspondingly to the elastic bumps 532, and the elastic protrusions 532 are elastically pressed against the members connected with the adjacent hinge protrusions 531 under actions of elasticity of the elastic elements 533.

For example, if the elastic bump 532 is hinged to the first flat plate portion 511, the elastic bump 532 is elastically pressed against the first side connecting rod 5131. If the elastic bump 532 is hinged to the second flat plate portion 512, the elastic bump 532 is elastically pressed against the second side connecting rod 5132. If the elastic bump 532 is hinged to the first side connecting rod 5131, the elastic bump 532 is elastically pressed against the middle side connecting rod. For the flexible panel 50, the elastic bump 532 and the elastic element 533 are linked to form linked elasticity of the adjacent first flat plate portion 511, second flat plate portion 512, first side connecting rod 5131, second side connecting rod 5132 and middle connecting rod 5133 to achieve an effect of an auxiliary force or a damping force to ensure higher movement stability of the flexible panel 50. In some embodiments of the present disclosure, the elastic element 533 is provided with a torsional spring.

Figure 7:
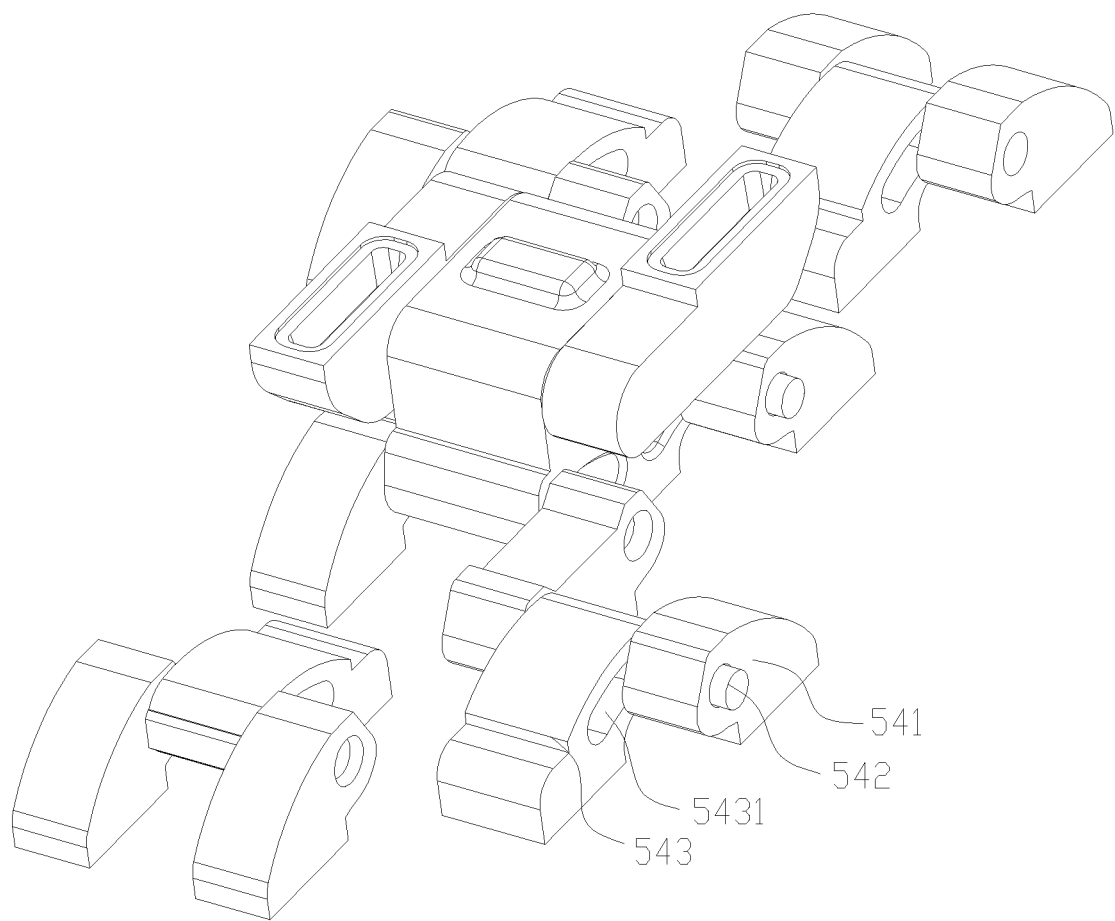
FIG. 7 is a structure diagram of a limiting assembly, according to some embodiments of the present disclosure.

As shown in FIG. 4 and FIG. 7, In some embodiments of the present disclosure, the flexible panel 50 further includes at least one limiting assembly 54 mounted to the hinge portion 513, and the limiting assembly 54 is connected to the first flat plate portion 511 and the second flat plate portion 512 respectively to limit a folded or unfolded dimension of the flexible panel 50. In some embodiments of the present disclosure, the limiting assembly 54 is hinged to the first flat plate portion 511 and the second flat plate portion 512 respectively to improve flexibility in rotation of the first flat plate portion 511 and the second flat plate portion 512 relative to the hinge portion 513. In some embodiments of the present disclosure, three limiting assemblies 54 are arranged and distributed at the hinge portion 513 at distances.

In some embodiments of the present disclosure, the limiting assembly 54 includes a movable block 543, a mounting block 541 and a limiting pin shaft 542 fixedly connected to the mounting block 541, and the mounting block 541 is fixedly connected to the hinge portion 513. The movable block 543 is provided with a slotted sliding hole 5431, and the limiting pin shaft 542 is inserted into the sliding hole 5431 and, when the hinge portion 513 is deformed, slides along a length direction of the sliding hole 5431. A hole wall of the sliding hole 5431 limits an extreme sliding position of the limiting pin shaft 542 to further control extreme unfolding or folding positions of the first flat plate portion 511 and the second flat plate portion 512, so that a good limiting effect is achieved, and the flexible panel 50 is prevented from being damaged by an external force.

Figure 8:
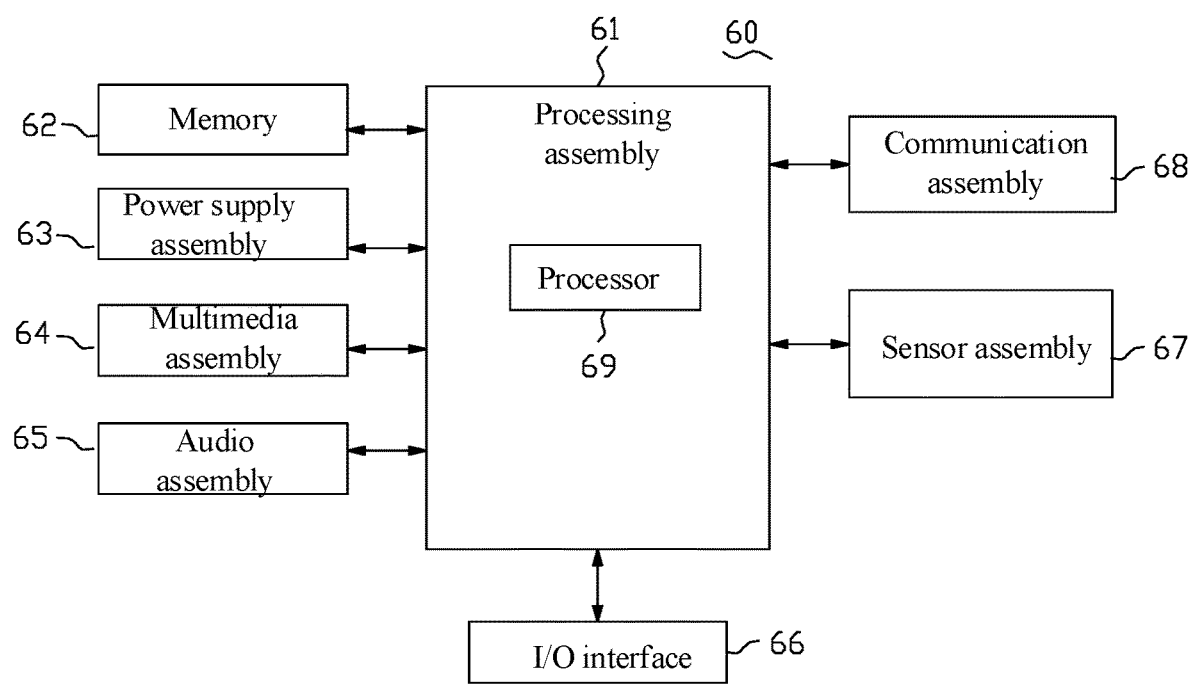
FIG. 8 is a schematic block diagram of a mobile terminal, according to some embodiments of the present disclosure.

As shown in FIG. 8, the display screen component disclosed in the abovementioned example is applied to a mobile terminal to improve flexibility in use of the display screen component and increase the space utilization rate. In some embodiments of the present disclosure, the mobile terminal includes a processor and a memory configured to store processor executable instructions. The mobile terminal further includes the display screen component disclosed in the abovementioned example, and the display screen component is in communication connection with the processor.

For example, the mobile terminal 60 may be a mobile phone, a computer, a digital broadcast terminal, a messaging device, a gaming console, a tablet, a medical device, exercise equipment, a personal digital assistant, a translator and the like.

The mobile terminal 60 may include one or more of the following assemblies: a processing assembly 61, a memory 62, a power supply assembly 63, a multimedia assembly 64, an audio assembly 65, an I/O interface 66, a sensor assembly 67, and a communication assembly 68.

The processing assembly 61 typically controls overall operations of the mobile terminal 60, such as the operations associated with display, telephone calls, data communications, camera operations, and recording operations. The processing assembly 61 may include one or more processors 69 to execute instructions to perform all or part of the steps in the abovementioned method. Moreover, the processing assembly 61 may include one or more components which facilitate interaction between the processing assembly 61 and the other assemblies. For instance, the processing assembly 61 may include a multimedia component to facilitate interaction between the multimedia assembly 64 and the processing assembly 61.

The various device components, circuits, modules, units, blocks, or portions may have modular configurations, or are composed of discrete components, but nonetheless can be referred to as "modules" in general. In other words, the "components," "circuits," "modules," "blocks," "portions," or "units" referred to herein may or may not be in modular forms.

The memory 62 is configured to store various types of data to support the operation of the mobile terminal 60. Examples of such data include instructions for any application programs or methods operated on the mobile terminal 60, contact data, phonebook data, messages, pictures, video, etc. The memory 62 may be implemented by any type of volatile or non-volatile memory devices, or a combination thereof, such as a Static Random-Access Memory (SRAM) 62, an Electrically Erasable Programmable Read-Only Memory (EEPROM) 62, an Erasable Programmable Read-Only Memory (EPROM) 62, a Programmable Read-Only Memory (PROM) 62, a Read-Only Memory (ROM) 62, a magnetic memory 62, a flash memory 62, and a magnetic or optical disk.

The power supply assembly 63 provides power for various assemblies of the mobile terminal 60. The power supply assembly 63 may include a power management system, one or more power supplies, and other assemblies associated with generation, management and distribution of power for the mobile terminal 60.

The multimedia assembly 64 includes a screen providing an output interface between the mobile terminal 60 and a user. In some examples, the screen may include a Liquid Crystal Display (LCD) and a Touch Panel (TP). In some embodiments, organic light-emitting diode (OLED) or other types of displays can be employed. If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action but also detect a duration and pressure associated with the touch or swipe action. In some examples, the multimedia assembly 64 includes a front camera and/or a rear camera. The front camera and/or the rear camera may receive external multimedia data when the mobile terminal 60 is in an operation mode, such as a photographing mode or a video mode. Each of the front camera and the rear camera may be a fixed optical lens system or have focusing and optical zooming capabilities.

The audio assembly 65 is configured to output and/or input an audio signal. For example, the audio assembly 65 includes a Microphone (MIC), and the MIC is configured to receive an external audio signal when the mobile terminal 60 is in the operation mode, such as a call mode, a recording mode and a voice recognition mode. The received audio signal may further be stored in the memory 62 or sent through the communication assembly 68. In some examples, the audio assembly 65 further includes a speaker configured to output the audio signal.

The I/O interface 66 provides an interface between the processing assembly 61 and a peripheral interface component, and the peripheral interface component may be a keyboard, a click wheel, a button and the like. The button may include, but not limited to: a home button, a volume button, a starting button and a locking button.

The sensor assembly 67 includes one or more sensors configured to provide status assessment in various aspects for the mobile terminal 60. For instance, the sensor assembly 67 may detect an on/off status of the device and relative positioning of assemblies, such as a display and small keyboard of the mobile terminal 60, and the sensor assembly 67 may further detect a change in a position of the mobile terminal 60 or an assembly of the mobile terminal 60, presence or absence of contact between the user and the mobile terminal 60, orientation or acceleration/deceleration of the mobile terminal 60 and a change in temperature of the mobile terminal 60. The sensor assembly 67 may include a proximity sensor configured to detect presence of an object nearby without any physical contact. The sensor assembly 67 may also include a light sensor, such as a Complementary Metal Oxide Semiconductor (CMOS) or Charge Coupled Device (CCD) image sensor, configured for use in an imaging application. In some examples, the sensor assembly 67 may also include an acceleration sensor, a gyroscope sensor, a magnetic sensor, a pressure sensor or a temperature sensor.

The communication component 416 is configured to facilitate wired or wireless communication between the terminal 400 and other equipment. The terminal 300 may access a communication-standard-based wireless network, such as a Wireless Fidelity (Wi-Fi) network, a 2nd-Generation (2G), 3rd-Generation (3G), $4^{th}$-Generation (4G), or $5^{th}$-Generation (5G) network or a combination thereof. In some embodiments of the present disclosure, the communication component 416 is configured to receive a broadcast signal or broadcast associated information from an external broadcast management system through a broadcast channel. In some embodiments of the present disclosure, the communication component 416 may further include a Near Field Communication (NFC) module to facilitate short-range communication. For example, the NFC module may be implemented based on a Radio Frequency Identification (RFID) technology, an Infrared Data Association (IrDA) technology, an Ultra-WideBand (UWB) technology, a Bluetooth (BT) technology and another technology.

In some embodiments of the present disclosure, the mobile terminal 60 may be implemented by one or more Application Specific Integrated Circuits (ASICs), Digital Signal Processors (DSPs) 69, Digital Signal Processing Devices (DSPDs), Programmable Logic Devices (PLDs), Field Programmable Gate Arrays (FPGAs), controllers, micro-controllers, microprocessors 69 or other electronic assemblies, and is configured to execute the abovementioned method.

Various embodiments of the present disclosure can have one or more of the following advantages.

The power assembly drives the movement assembly to move to control the flexible panel to move to the folded state or the unfolded state, so that convenience for control is ensured. One end of the connecting rod assembly is movably connected to the movement assembly and rotates along with movement of the movement assembly, the other end of the connecting rod assembly is connected to the flexible panel. The connecting rod assembly drives at least a part of the flexible panel to be unfolded or folded during the movement of the connecting rod assembly, so that running stability during movement of the flexible panel can be achieved.

In some embodiments of the present disclosure, the power assembly may drive the movement assembly to move linearly.

In some embodiments of the present disclosure, the power assembly may be in screw driving connection with the movement assembly.

In some embodiments of the present disclosure, the power assembly may include a power element and a transmission part connected to the power element, the at least one movement assembly may be connected to the transmission part, and the power element may drive the transmission part into rotation to drive the at least one movement assembly to move along an axial direction of the transmission part.

In some embodiments of the present disclosure, the power assembly may further include a support member spaced from the power element, and the transmission part may be supported by the support member and rotatably connected with the support member.

In some embodiments of the present disclosure, there may be two or more movement assemblies spaced from each other by a preset distance, and the power assembly may drive the movement assemblies to move synchronously.

In some embodiments of the present disclosure, the connecting rod assembly may include a left support rod and right support rod respectively connected to the movement assembly. The left support rod and the right support rod may also be connected to the flexible panel respectively. The left support rod and the right support rod may be splayed or brought together relative to each other along with movement of the movement assembly.

In some embodiments of the present disclosure, each of the left support rod and the right support rod may include a support rod portion, as well as a first connecting end and second connecting end located at two ends of the support rod portion respectively. The first connecting end may be movably connected to the movement assembly, and the second connecting end may be movably connected to the flexible panel.

In some embodiments of the present disclosure, at least one of the first connecting end or the second connecting end may be provided with a spherical connecting portion.

In some embodiments of the present disclosure, the left support rod and the right support rod may be symmetric with each other.

In some embodiments of the present disclosure, the connecting rod assembly may be in movable spherical connection with the movement assembly.

In some embodiments of the present disclosure, the movement assembly may include a movement body movably connected to the power assembly and a rotating portion arranged at the movement body. The connecting rod assembly may be rotatably connected to the rotating portion.

In some embodiments of the present disclosure, the rotating portion may include at least one connecting protrusion protruding from the movement body. The connecting rod assembly may be rotatably connected with the connecting protrusion.

In some embodiments of the present disclosure, the connecting protrusion may be provided with a spherical groove. The connecting rod assembly may be movably connected to the spherical groove.

In some embodiments of the present disclosure, the flexible panel may include a panel body and a bracket body mounted to the panel body. The folding device may be mounted to the bracket body and capable of driving the bracket body to be splayed or contracted to place the panel body at a corresponding angle.

In some embodiments of the present disclosure, the bracket body may include a first flat plate portion, a second flat plate portion and a hinge portion connecting the first flat plate portion with the second flat plate portion. The power assembly may be mounted to the hinge portion, and the connecting rod assembly may be movably connected to the first flat plate portion and the second flat plate portion.

In some embodiments of the present disclosure, the hinge portion may include a first side connecting rod, a second side connecting rod and at least one middle connecting rod which is parallel to the first side connecting rod and the second side connecting rod and is distributed between the first side connecting rod and the second side connecting rod. The first side connecting rod and the second side connecting rod may be hingedly connected to the middle connecting rod, the first flat plate portion may be movably connected to the first side connecting rod, and the second flat plate portion may be movably connected to the second side connecting portion.

In some embodiments of the present disclosure, the first flat plate portion may be provided with at least one first connecting portion. The second flat plate portion may be provided with at least one second connecting portion. The connecting rod assembly may be movably connected to the first connecting portion and the second connecting portion respectively.

In some embodiments of the present disclosure, the first connecting portion may be provided with a first spherical connecting trough, and the connecting rod assembly may be rotatably connected with the first spherical connecting trough; and/or, the second connecting portion may be provided with a second spherical connecting trough, and the connecting rod assembly may be rotatably connected with the second spherical connecting trough.

In some embodiments of the present disclosure, the flexible panel may further include at least one hinging assembly, and the hinging assembly may be configured to connect the first flat plate portion, the second flat plate portion and the hinge portion, to connect the first flat plate portion, the second flat plate portion and the hinge portion into a whole and allow a relative rotation between the first flat plate portion, the second flat plate portion and the hinge portion.

In some embodiments of the present disclosure, the flexible panel may further include at least one limiting assembly mounted to the hinge portion. The limiting assembly may be connected to the first flat plate portion and the second flat plate portion respectively to limit a folded or unfolded dimension of the flexible panel.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variations of a subcombination. It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A folding device, comprising:
   a power assembly;
   at least one movement assembly coupled with the power assembly; and
   at least one group of connecting rod assembly movably coupled with the movement assembly; wherein:
      the connecting rod assembly is configured to movably couple with a flexible panel, and the power assembly is arranged to be fixed relative to the flexible panel;
      the movement assembly is configured to be moved by the power assembly;
      the connecting rod assembly is configured to move along with the movement of the movement assembly and rotate relative to the movement assembly; and
      at least a part of the flexible panel is driven by the connecting rod assembly to move and be in a folded state or an unfolded state.

2. The folding device of claim 1, wherein the power assembly is configured to drive the movement assembly to move linearly.

3. The folding device of claim 2, wherein the power assembly is in a screw-driving connection with the movement assembly.

4. The folding device of claim 3, wherein the power assembly comprises a power element and a transmission part connected to the power element, the at least one movement assembly being connected to the transmission part, the power element driving the transmission part into rotation to drive the at least one movement assembly to move along an axial direction of the transmission part.

5. The folding device of claim 4, wherein the power assembly further comprises a support member spaced from the power element, and the transmission part is supported by the support member and rotatably connected with the support member.

6. The folding device of claim 1, wherein the connecting rod assembly comprises a left support rod and right support rod respectively connected to the movement assembly, the left support rod and the right support rod being also connected to the flexible panel respectively, the left support rod and the right support rod are splayed or brought together relative to each other along with movement of the movement assembly.

7. The folding device of claim 6, wherein each of the left support rod and the right support rod comprises a support rod portion, as well as a first connecting end and second connecting end located at two ends of the support rod portion respectively, the first connecting end being movably connected to the movement assembly, and the second connecting end being movably connected to the flexible panel.

8. The folding device of claim 7, wherein at least one of the first connecting end or the second connecting end is provided with a spherical connecting portion.

9. The folding device of claim 6, wherein the left support rod and the right support rod are symmetric with each other.

10. The folding device of claim 1, wherein the connecting rod assembly is in movable spherical connection with the movement assembly.

11. The folding device of claim 1, wherein the movement assembly comprises a movement body movably connected to the power assembly and a rotating portion arranged at the movement body, the connecting rod assembly being rotatably connected to the rotating portion.

12. A display screen component, comprising a flexible panel and at least one folding device,
the folding device comprises a power assembly, at least one movement assembly connected with the power assembly and at least one group of connecting rod assembly movably connected to the movement assembly, wherein the connecting rod assembly is configured to movably connect to a flexible panel, and the power assembly is arranged to be fixed relative to the flexible panel; and
the movement assembly is moved by the power assembly, the connecting rod assembly moves along with the movement of the movement assembly and rotates relative to the movement assembly, and at least a part of the flexible panel is driven by the connecting rod assembly to move and be in a folded state or an unfolded state,
the flexible panel is a flexible display screen.

13. The display screen component of claim 12, wherein the flexible panel comprises a panel body and a bracket body mounted to the panel body, the folding device being mounted to the bracket body and capable of driving the bracket body to be splayed or contracted to place the panel body at a corresponding angle.

14. The display screen component of claim 13, wherein the bracket body comprises a first flat plate portion, a second flat plate portion and a hinge portion connecting the first flat plate portion with the second flat plate portion, the power assembly being mounted to the hinge portion, and the connecting rod assembly being movably connected to the first flat plate portion and the second flat plate portion.

15. The display screen component of claim 14, wherein the hinge portion comprises a first side connecting rod, a second side connecting rod and at least one middle connecting rod which is parallel to the first side connecting rod and the second side connecting rod and is distributed between the first side connecting rod and the second side connecting rod, the first side connecting rod and the second side connecting rod being hingedly connected to the middle connecting rod, the first flat plate portion being movably connected to the first side connecting rod, the second flat plate portion being movably connected to the second side connecting portion.

16. The display screen component of claim 14, wherein the first flat plate portion is provided with at least one first connecting portion, the second flat plate portion is provided with at least one second connecting portion, the connecting rod assembly being movably connected to the first connecting portion and the second connecting portion respectively.

17. The display screen component of claim 16, wherein the first connecting portion is provided with a first spherical connecting trough, and the connecting rod assembly is rotatably connected with the first spherical connecting trough; and/or, the second connecting portion is provided with a second spherical connecting trough, and the connecting rod assembly is rotatably connected with the second spherical connecting trough.

18. The display screen component of claim 16, wherein the flexible panel further comprises at least one hinging assembly configured to connect the first flat plate portion, the second flat plate portion and the hinge portion, to connect the first flat plate portion, the second flat plate portion and the hinge portion into a whole and allow a relative rotation between the first flat plate portion, the second flat plate portion and the hinge portion.

19. The display screen component of claim 14, wherein the flexible panel further comprises at least one limiting assembly mounted to the hinge portion, the limiting assembly being connected to the first flat plate portion and the second flat plate portion respectively, to limit a folded or unfolded dimension of the flexible panel.

20. A mobile terminal comprising:
a folding device; and
a flexible display screen; wherein:
the folding device comprises:
a power assembly;
at least one movement assembly coupled with the power assembly; and
a connecting rod assembly movably;
one end of the connecting rod assembly is movably coupled with the movement assembly;
another end of the connecting rod assembly is movably coupled the flexible display screen;
the power assembly is arranged to be fixed relative to the flexible display screen;
the movement assembly is configured to be moved by the power assembly;
the connecting rod assembly is configured to move along with the movement of the movement assembly and rotate relative to the movement assembly;
at least a part of the flexible panel is configured to be driven by the connecting rod assembly to move and be in a folded state or an unfolded state to ensure running stability during movement of the flexible display screen.

* * * * *